(12) United States Patent
Liu et al.

(10) Patent No.: US 8,624,441 B2
(45) Date of Patent: Jan. 7, 2014

(54) CONTROL CIRCUIT OF CYCLING SWITCH AND CONTROL METHOD THEREOF

(75) Inventors: Te-Chung Liu, Taoyuan Hsien (TW); Yi-Hua Lee, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 638 days.

(21) Appl. No.: 12/958,779

(22) Filed: Dec. 2, 2010

(65) Prior Publication Data

US 2011/0148508 A1    Jun. 23, 2011

(30) Foreign Application Priority Data

Dec. 21, 2009  (TW) ................................ 98143854 A

(51) Int. Cl.
  *H01H 83/00* (2006.01)
  *H02H 3/00* (2006.01)
  *H01H 47/00* (2006.01)

(52) U.S. Cl.
  USPC ........... 307/130; 307/112; 307/113; 307/125; 307/126; 307/131; 323/284

(58) Field of Classification Search
  USPC ........................................................ 307/130
  See application file for complete search history.

(56) References Cited

U.S. PATENT DOCUMENTS

| 6,307,352 | B1 * | 10/2001 | Hooper | 320/139 |
| 6,316,915 | B1 * | 11/2001 | Fujiwara et al. | 320/134 |
| 7,414,381 | B2 * | 8/2008 | Popescu-Stanesti et al. | 320/126 |

* cited by examiner

*Primary Examiner* — Rexford Barnie
*Assistant Examiner* — Toan Vu
(74) *Attorney, Agent, or Firm* — Muncy, Geissler, Olds & Lowe, PLLC

(57) ABSTRACT

A control circuit of a cycling switch for controlling an electronic equipment includes a switch loop, a first control loop and a second control loop. The switch loop generates a driving signal to drive the electronic equipment. The first control loop is electrically connected with the switch loop and the electronic equipment respectively, and generates a first control signal according to a variation of the driving signal. The second control loop is electrically connected with the first control loop and the electronic equipment respectively. The second control loop has a storage unit which charges and discharges according to the first control signal, so that the second control loop generates a second control signal. The second control signal is inputted to the first control loop and controls the electronic equipment. A control method applied to the control circuit of the cycling switch is also disclosed.

23 Claims, 8 Drawing Sheets

CONTROL CIRCUIT OF CYCLING SWITCH AND CONTROL METHOD THEREOF

CROSS REFERENCE TO RELATED APPLICATIONS

This Non-provisional application claims priority under 35 U.S.C. §119(a) on Patent Application No(s). 098143854 filed in Taiwan, Republic of China on Dec. 21, 2009, the entire contents of which are hereby incorporated by reference.

BACKGROUND OF THE INVENTION

1. Field of Invention

The invention relates to a control circuit and a control method thereof. More particularly, the invention relates to a control circuit of a cycling switch and a control method thereof.

2. Related Art

The conventional control switch or circuit applied to the electronic equipment can be involved in the following three types. The first type is to use a mechanical control switch to control the electronic equipment, so that the operation modes and functions of the electronic equipment can be changed by switching the mechanical control switch. The second type is to use a plurality of control switches, so that the electronic equipment can be switched to different operation modes and functions by the settings of the control switches.

FIG. 1 is a schematic diagram showing a conventional control circuit of the third type for controlling the electronic equipment F1 to operate in different operation modes and functions. According to the layout design of the control circuit, the power and state signals of the electronic equipment F1 can be stored in the storage element 211 of the control loop 21 (e.g. a capacitor). Then, the control switches SW1, SW2 and SW3 can operate and switch the signals to change the power and state signals stored in the storage element 211 of the control loop 21, thereby changing the operation mode and function of the electronic equipment F1.

However, although the above-mentioned first and second types of control circuits have the advantage of simple design, they need many switch circuits for switching between different operation modes, which may result in very complex wiring and layout. In this case, if the electronic equipment is damaged and the switch is needed to be replaced, it must consume a lot of working time for the replacement due to the complex wiring and layout.

In addition, although the third type of control circuit has the simpler control switches design, however, the control loop 21 needs a storage element 211 for storing the power and state signals. In this case, the storage element 211 has may discharge routes, so that the electricity stored in the storage element 211 can not be kept for a long time. In order to extend the storage time, the storage element 211 with larger capacity is desired. However, the storage element 211 with larger capacity also has large volume, which will result in the waste of space, especially in the situation of no operation mode and function changes. Moreover, when the switch SW3 is turned off, the power signal ACS can be still applied to the resistor R4, power loop 22, driving loop 23 and control loop 21, which may keep consuming the power.

Therefore, it is an important aspect of the invention to provide a control circuit that does not need the storage element with large capacity and can still achieve the purpose of energy saving.

SUMMARY OF THE INVENTION

In view of the foregoing, one aspect of the invention is to provide a control circuit of a cycling switch that does not need the storage element with large capacity and can still achieve the purpose of energy saving.

To achieve the above-mentioned aspect, one embodiment of the invention discloses a control circuit of a cycling switch for controlling an electronic equipment to operate in different operation modes and functions. The control circuit includes a switch loop, a first control loop, and a second control loop. The switch loop generates a driving signal to drive the electronic equipment. The first control loop is electrically connected with the switch loop and the electronic equipment respectively, and generates a first control signal according to a variation of the driving signal.

The first control loop includes a first filter unit electrically connected with the switch loop and outputs a pulse signal according to the variation of the driving signal. In addition, the first control loop further includes a trigger unit electrically connected with the first filter unit and generates a trigger signal according to the second control signal and the pulse signal. The first control loop may further includes a delay unit electrically connected with the trigger unit and the second control loop for delaying the trigger signal, thereby delaying the first control signal.

The second control loop is electrically connected with the first control loop and the electronic equipment respectively, and has a storage unit, which charges and discharges according to the first control signal so as to control the second control loop to generate a second control signal inputted to the first control loop and then to control the electronic equipment to operate in different operation modes and functions. In addition, the second control loop further includes an inverter unit and a discharging unit. The inverter unit is electrically connected with the delay unit and the discharging unit, and the discharging unit is electrically connected with the storage unit. The inverter unit controls to enable/disable the discharging unit according to the first control signal.

In addition, the second control loop may further include a charging unit electrically connected with the delay unit, the inverter unit, the discharging unit, and the storage unit for charging the storage unit based on the first control signal. In one aspect, the inverter unit includes a first switch electrically connected with the discharging unit. When the first switch is turned on based on the first control signal, the discharging unit is disabled so that the storage unit is not discharged; otherwise, when the first switch is turned off based on the first control signal, the discharging unit is enabled so that the storage unit is discharged.

In one embodiment of the invention, the control circuit further includes a converter loop electrically connected with the switch loop and generating a DC signal according to an AC signal to the switch loop.

In one embodiment of the invention, the control circuit further includes a power switch electrically connected with the switch loop. When the power switch is turned on, the converter loop outputs the DC signal according to the AC signal.

In one embodiment of the invention, the control circuit further includes a third control loop electrically connected with the switch loop and the converter loop respectively. The third control loop outputs a third control signal according to the AC signal to enable the switch loop, so that the switch loop generates the driving signal according to the DC signal to drive the electronic equipment. In this case, the third control loop includes a transformer unit and a second filter unit. The transformer unit is electrically connected with the converter loop and the second filter unit. The transformer unit outputs a transform signal according to the AC signal to the second filter unit, so that the second filter unit generates the third control signal to control the switch loop To achieve the above-mentioned aspect, one embodiment of the invention also discloses a control method of a control circuit of a cycling switch for controlling an electronic equipment to operate in different operation modes and functions. The control circuit includes a power switch, a switch loop, a first control loop and a second control loop. The switch loop outputs a driving signal, while the power switch is turned on, to drive the electronic equipment, and the second control loop includes a storage unit.

The control method according to one embodiment of the invention includes the following steps of: determining whether the state of the power switch is changed or not; altering the driving signal outputted from the switch loop according to the change of the state of the power switch; generating a first control signal by the first control loop according to a variation of the driving signal; controlling or altering the state of the storage unit by the second control loop according to the first control signal; and generating a second control signal according to the change of the state of the storage unit.

In one embodiment of the invention, the step of determining whether the state of the power switch is changed or not is performed by a third control loop. The step of altering the driving signal outputted from the switch loop is performed by using the third control loop to generate a third control signal to alter the state of the switch loop, thereby altering the driving signal.

In one embodiment of the invention, in the step of generating a first control signal by the first control loop, the first control loop can output a pulse signal according to the variation of the driving signal to a trigger unit. Then, the trigger unit generates a trigger signal according to the second control signal and the pulse signal, so that the first control signal can be then generated. Herein, to change the state of the storage unit is to charge or discharge the storage unit.

In one embodiment of the invention, the control method further includes a step of discharging the storage unit through a discharging unit, and a step of charging the storage unit through a charging unit. Herein, the charging unit can disable the discharging unit according to the first control signal and then charging the storage unit, thereby changing the second control signal. Thus, the electronic equipment can be operated in different operation modes and functions. In addition, the charging unit may include a diode for preventing the electricity leakage of the storage unit.

The inverter unit can enable the discharging unit according to the first control signal so as to discharge the storage unit. Moreover, the inverter unit includes a first switch, and when the first switch is turned on based on the first control signal, the discharging unit is disabled so that the storage unit is not discharged.

As mentioned above, in the control circuit of a cycling switch and the control method thereof of one embodiment of the invention, the charging and discharging of the storage unit of the second control loop can control the electronic equipment to switch between different operation modes and functions. Thus, the wiring design between the control circuit and the electronic equipment can be simplified, and it may also be simpler to replace the switch in the equipment. In addition, the electricity may be stored in the storage unit within the control circuit, and it may support the electronic equipment to function for a while during the actions of starting and shutting down of the electronic equipment. Therefore, the control circuit of one embodiment of the invention does not need a storage device with a large capacity, and it still can achieve the purpose of energy saving.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 2:
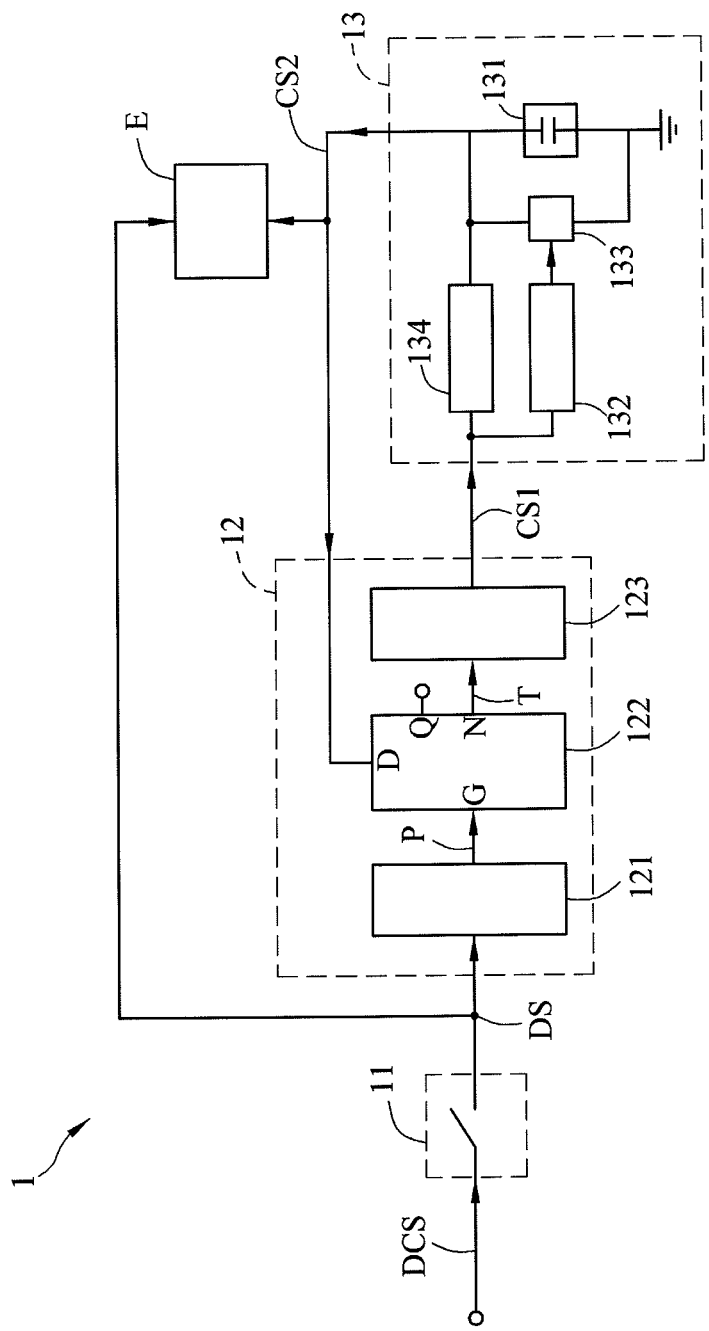
FIG. 2 is a schematic diagram of a control circuit of a cycling switch according to one embodiment of the invention.

FIG. 2 is a schematic diagram of a control circuit 1 of a cycling switch according to one embodiment of the invention.

The control circuit 1 includes a switch loop 11, a first control loop 12, and a second control loop 13. The control circuit 1 is capable of controlling an electronic equipment E to operate in different operation modes and functions. The electronic equipment E may be a fan, a dryer or a lamp, and in the embodiment, the electronic equipment E is, for example but not limited to, a fan.

The switch loop 11 generates a driving signal DS to drive the electronic equipment E. In the embodiment, when the switch loop 11 is enabled, it outputs the driving signal DS according to a DC signal DCS to control the electronic equipment E to operate. Herein, the electronic equipment E includes a driving circuit (not shown) for enabling the electronic equipment E to operate according to the driving signal DS.

In the embodiment, the electronic equipment E may be driven by direct current for example. Otherwise, if the electronic equipment E is driven by alternate current, it should include a DC-to-AC converter (not shown) for converting the inputted DC driving signal DS to an AC signal so as to drive the electronic equipment E.

The first control loop 12 is electrically connected with the switch loop 11 and the electronic equipment E respectively, and generates a first control signal CS1 according to a variation of the driving signal DS. For example, the first control loop 12 may include a first filter unit 121, a trigger unit 122, and a delay unit 123. The first filter unit 121 is electrically connected with the switch loop 11 and the electronic equipment E, the trigger unit 122 is electrically connected with the first filter unit 121, and the delay unit 123 is electrically connected with the trigger unit 122 and the second control loop 13.

The first filter unit 121 outputs a pulse signal P according to the variation of the driving signal DS. In this embodiment, the first filter unit 121 is, for example, a high-pass filter, which allows only the high-frequency signals to pass through and filter out the low-frequency signals. Thus, when the switch loop 11 is continuously enabled, because the driving signal DS is not changed and the driving signal DS does not includes high frequency, the first filter unit 121 can not output the pulse signal P. Accordingly, the first control signal CS1 can not be generated, and the operation mode and function of the electronic equipment E is not changed.

The trigger unit 122 generates a trigger signal T according to the pulse signal P and a second control signal CS2 outputted by the second control loop 13. For example, the trigger unit 122 may be a D-type flip-flop that is positive edge triggered or negative edge triggered. In this embodiment, the trigger unit 122 is a D-type flip-flop that is positive edge triggered.

The following Table 1 is a truth table of the trigger unit 122, wherein D represents the input of the flip-flop, G represents the enable input of the flip-flop, Q represents the output of the flip-flop, and N represents another output of the flip-flop. The levels of N and Q are in opposite. For example, when Q is in a high level, N is in a low level; otherwise, when Q is in a low level, N is in a high level.

TABLE 1

| G | D | Q | N |
|---|---|---|---|
| 0 | X | Q | N |
| 1 | X | Q | N |
| ↑ | 0 | 0 | 1 |
| ↑ | 1 | 1 | 0 |

As shown in Table 1, only when the enable input G of the flip-flop changes from the low level (0) to the high level (1), the level of the output Q of the flip-flop is equal to that of the input D. Meanwhile, the output Q of the flip-flop will keep at the same level until next level change (the enable input G of the flip-flop changes from the high level (1) to the low level (0)). In addition, because the level of the output Q of the flip-flop is equal to that of the input D of the flip-flop, the level of output N is in opposite to that of the input D.

At the timing that the level the enable input G of the trigger unit 122 changes from the low level to the high level, the signal outputted from the output Q of the trigger unit 122 has the same level as that outputted from the input D of the trigger unit 122 (the second control signal CS2 outputted by the second control loop 13). In other words, when the level of the pulse signal P changes from the low level to the high level, the level of the trigger signal T outputted by the trigger unit 122 (from the output N of the trigger unit 122) is in opposite to that of the second control signal CS2.

The trigger unit 122 outputs the trigger signal T to the delay unit 123, and the delay unit 123 delays the trigger signal T for a while and then output it. The delayed signal is the first control signal CS1, which is then transmitted to the second control loop 13.

The second control loop 13 is electrically connected with the first control loop 12 and the electronic equipment E respectively. The second control loop 13 includes a storage unit 131, which charges and discharges according to the first control signal CS1. Thus, the second control loop 13 generates a second control signal CS2, which is then inputted to the first control loop 12 and controls the operation mode of the electronic equipment E. In this embodiment, the storage unit 131 is a capacitor for example.

The second control loop 13 further includes an inverter unit 132 and a discharging unit 133. The inverter unit 132 is electrically connected with the delay unit 123 and the discharging unit 133, and the discharging unit 133 is electrically connected with the storage unit 131. The inverter unit 132 inverts the first control signal CS1 for controlling to enable/disable the discharging unit 133. The storage unit 131 is discharged when the discharging unit 133 is enabled.

The second control loop 13 may further include a charging unit 134 electrically connected with the delay unit 123, the inverter unit 132, the discharging unit 133, and the storage unit 131. The charging unit 134 charges the storage unit 131 based on the first control signal CS1. For example, when the first control signal CS1 is in a high level, it flows through the charging unit 134 and then charges the storage unit 131, and the discharging unit 133 is disabled.

Figure 3:
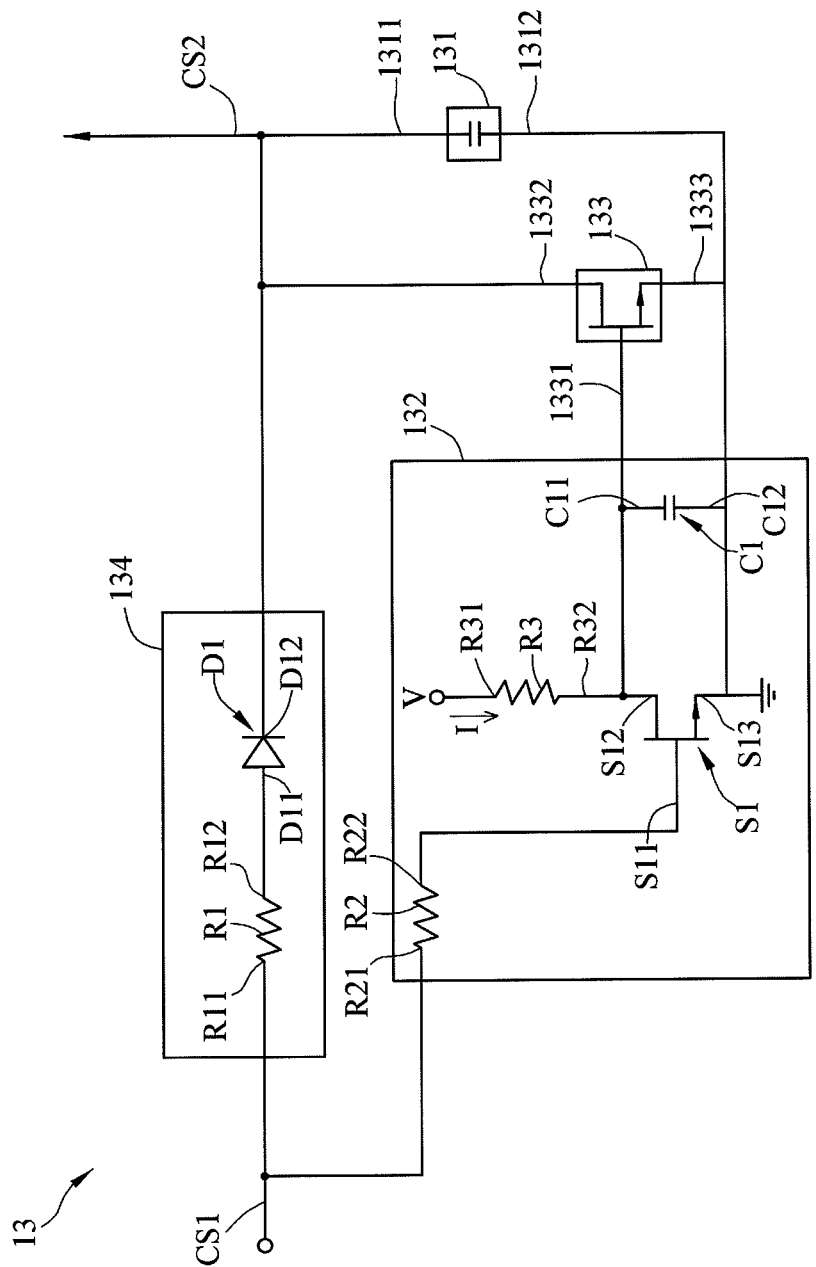
FIG. 3 is a circuit diagram of one embodiment of a second control loop of the control circuit.

FIG. 3 is a circuit diagram of the second control loop 13 of the control circuit 1 according to one embodiment of the invention.

For example, the charging unit 134 includes a first resistor R1 and a diode D1. A first end R11 of the first resistor R1 is electrically connected with the output of the delay unit 123, and a second end R12 thereof is electrically connected with a first end D11 of the diode D1. A second end D12 of the diode D1 is electrically connected with a first end 1331 of the discharging unit 133 and a first end 1311 of the storage unit 131.

When the first control signal CS1 is in the high level, it flows through the first resistor R1 and the diode D1 to rapidly charging the storage unit 131. Meanwhile, the second control signal CS2 is changed to high level and then transmitted to the trigger unit 122 and the electronic equipment E (not shown in FIG. 3), thereby changing the operation modes and functions of the electronic equipment E.

Figure 1:
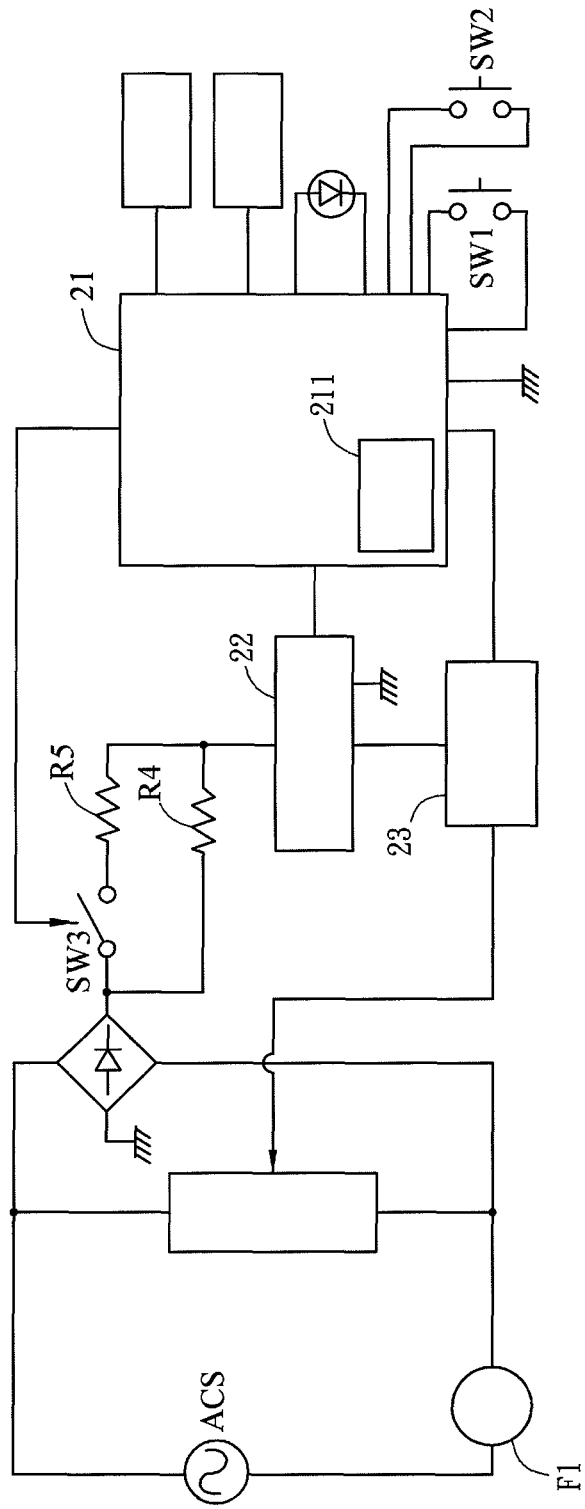
FIG. 1 is a schematic diagram showing a conventional control circuit for controlling the electronic equipment to operate in different operation modes and functions.

Regarding to the storage unit 131, the diode D1 is in reverse bias when the discharging unit 133 is disabled, so that the electricity stored in the storage unit 131 is not leaked quickly. Thus, during the operation mode switching of the electronic equipment E, the control circuit 1 can still supply power to the electronic equipment E for a while. Consequently, the storage unit 131 does not need the capacitor with larger capacity, such as the storage element 211 of FIG. 1 that is necessary in the conventional control circuit. In addition, the power loop 22 and the driving loop 23 may have noise capacitances.

The inverter unit 132 may include a second resistor R2, a third resistor R3, a first switch S1, and a first capacitor C1. A first end R21 of the second resistor R2 is electrically connected with the first end R11 of the first resistor R1 and the output of the delay unit 123, and a second end R22 thereof is electrically connected with a first end S11 of the first switch S1. A second end S12 of the first switch S1 is electrically connected with the first end 1331 of the discharging unit 133, a first end C11 of the first capacitor C1, and a second end R32 of the third resistor R3. A third end S13 of the first switch S1 is electrically connected with a second end C12 of the first capacitor C1, a third end 1333 of the discharging unit 133, and a second end 1312 of the storage unit 131, and then grounded. A first end R31 of the third resistor R3 is electrically connected with a constant voltage source V.

Each of the discharging unit 133 and the first switch S1 is a field-effect transistor (FET), such as a JFET or a MOSFET. In one embodiment, each of the discharging unit 133 and the first switch S1 is for example an NMOSFET.

When the first control signal CS1 is in high level and the first switch S1 is turned on, the power source V induces a current I flowing through the third resistor R3 and then passing through the second end S12 of the first switch S1 and the third end S13 of the first switch S1. The current I does not flow through the first end 1331 of the discharging unit 133, so the discharging unit 133 is disabled. Accordingly, the storage unit 131 is not discharged, and the level of the second control signal CS2 is not changed, which means the operation mode and function of the electronic equipment E is not changed.

When the first control signal CS1 is in low level and the first switch S1 is turned off, the power source V induces a current I flowing through the third resistor R3 and then transmitted to the first end C11 of the first capacitor C1. Then, the first capacitor C1 is charged to enable the discharging unit 133, so that the storage unit 131 is discharged through the second end 1332 of the discharging unit 133 and the third end 1333 of the discharging unit 133. Meanwhile, the level of the second control signal CS2 is decreased and it becomes a low level signal.

Figure 4A:
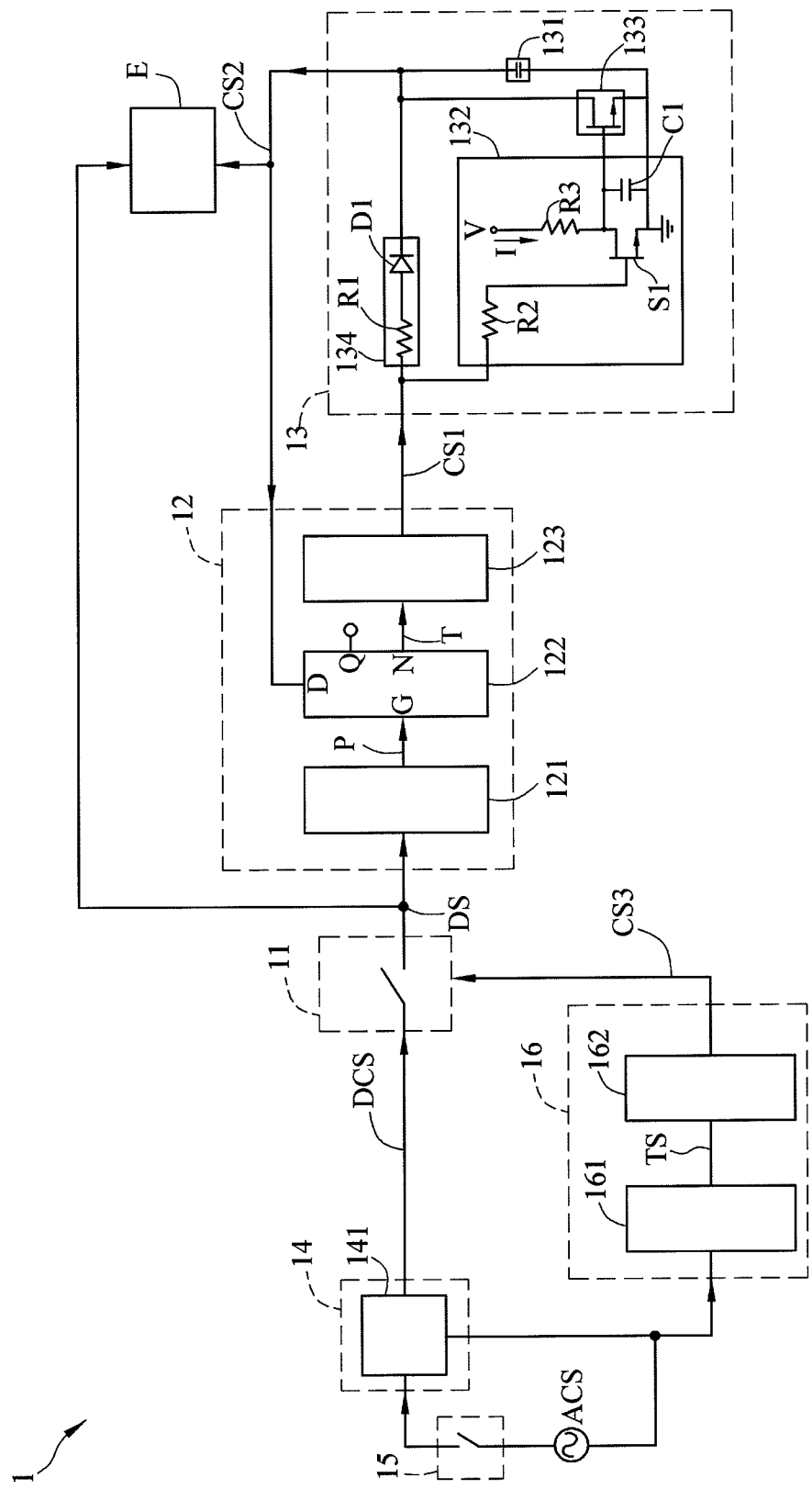
FIG. 4A and FIG. 4B are schematic diagrams respectively showing other control circuits of a cycling switch according to one embodiment of the invention.

With reference to FIG. 4A, the control circuit 1 of one embodiment may further include a converter loop 14 and a power switch 15. The converter loop 14 is electrically connected with the switch loop 11 and the power switch 15. When the power switch 15 is turned on, the converter loop 14 generates a DC signal DCS according to an AC signal ACS and transmits the DC signal DCS to the switch loop 11. In this case, the converter loop 14 includes an AC/DC converter 141 for converting the inputted AC signal ACS to a DC signal DCS. The AC/DC converter 141 is commonly used in the prior art, so the detailed description thereof will be omitted.

The control circuit 1 may further include a third control loop 16, which is electrically connected with the switch loop 11 and the converter loop 14. In the embodiment, the third control loop 16 outputs a third control signal CS3 according to the AC signal ACS to enable the switch loop 11, so that the switch loop 11 generates the driving signal DS according to the DC signal DCS to drive the electronic equipment E.

For example, when the power switch 15 is turned on, the AC signal ACS is transmitted to the converter loop 14 and the third control loop 16. The AC signal ACS is converted to form the DC signal DCS by the AC/DC converter 141, the DC signal DCS is then transmitted to the switch loop 11. In addition, the third control loop 16 outputs the third control signal CS3 to the switch loop 11 for enabling the switch loop 11, so that the switch loop 11 generates the driving signal DS to drive the electronic equipment E. When the power switch 15 is continuously turned on, the third control loop 16 can continuously output the third control signal CS3 for enabling the switch loop 11, so that the electronic equipment E may continuously operating without changing its operation mode and function.

For example, the third control loop 16 may include a transformer unit 161 and a second filter unit 162. The transformer unit 161 is electrically connected with the converter loop 14 and the second filter unit 162, and the second filter unit 162 is electrically connected with the switch loop 11. The transformer unit 161 outputs a transform signal TS according to the AC signal ACS to the second filter unit 162, so that the second filter unit 162 generates the third control signal CS3 to enable/disable the switch loop 11.

In one embodiment, the transformer unit 161 attenuates the AC signal ACS to generate the transform signal TS and then outputs it to the second filter unit 162. The second filter unit 162 is, for example, a low-pass filter, which allows only the low-frequency signals (e.g. 60 Hz) to pass through and filter out the high-frequency signals. Accordingly, when the power switch 15 is continuously turned on, the second filter unit 162 of the third control loop 16 allows the low-frequency AC signal ACS to pass through. Thus, the third control signal CS3 is continuously outputted to enable the switch loop 11 to continuously output the driving signal DS, so that the electronic equipment E may continuously operating without changing its operation mode and function.

Figure 4B:
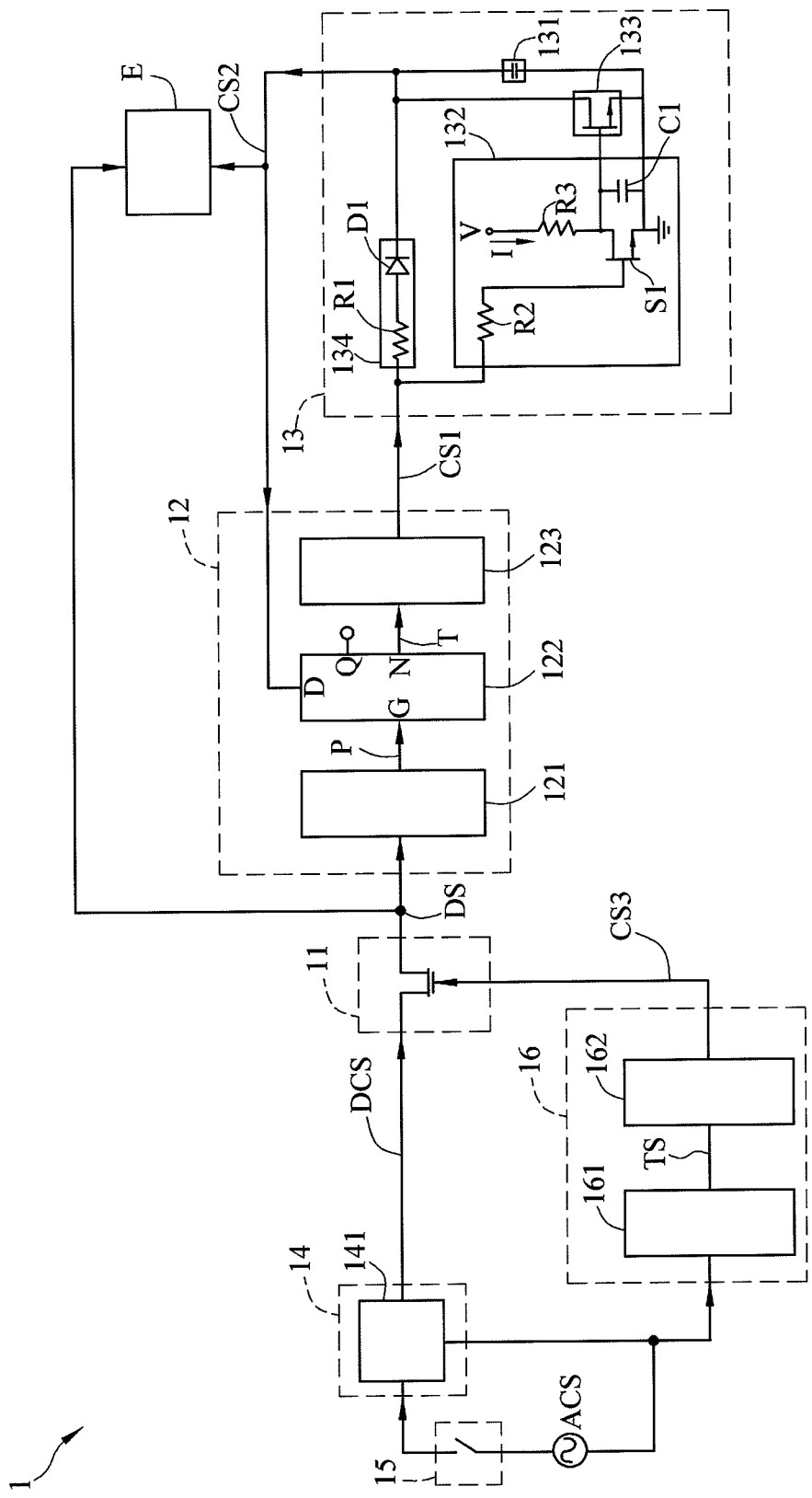

In one embodiment of the invention (see FIG. 4B), the switch loop 11 may be an EFT, which has a gate electrically connected with the third control loop 16, a source electrically connected with the converter loop 14, and a drain electrically connected with the first control loop 12. The third control loop 16 outputs the third control signal CS3 to the gate of the EFT for enabling the switch loop 11, so that the switch loop 11 outputs the driving signal DS to the electronic equipment E and the first control loop 12 for controlling them.

Figure 5:
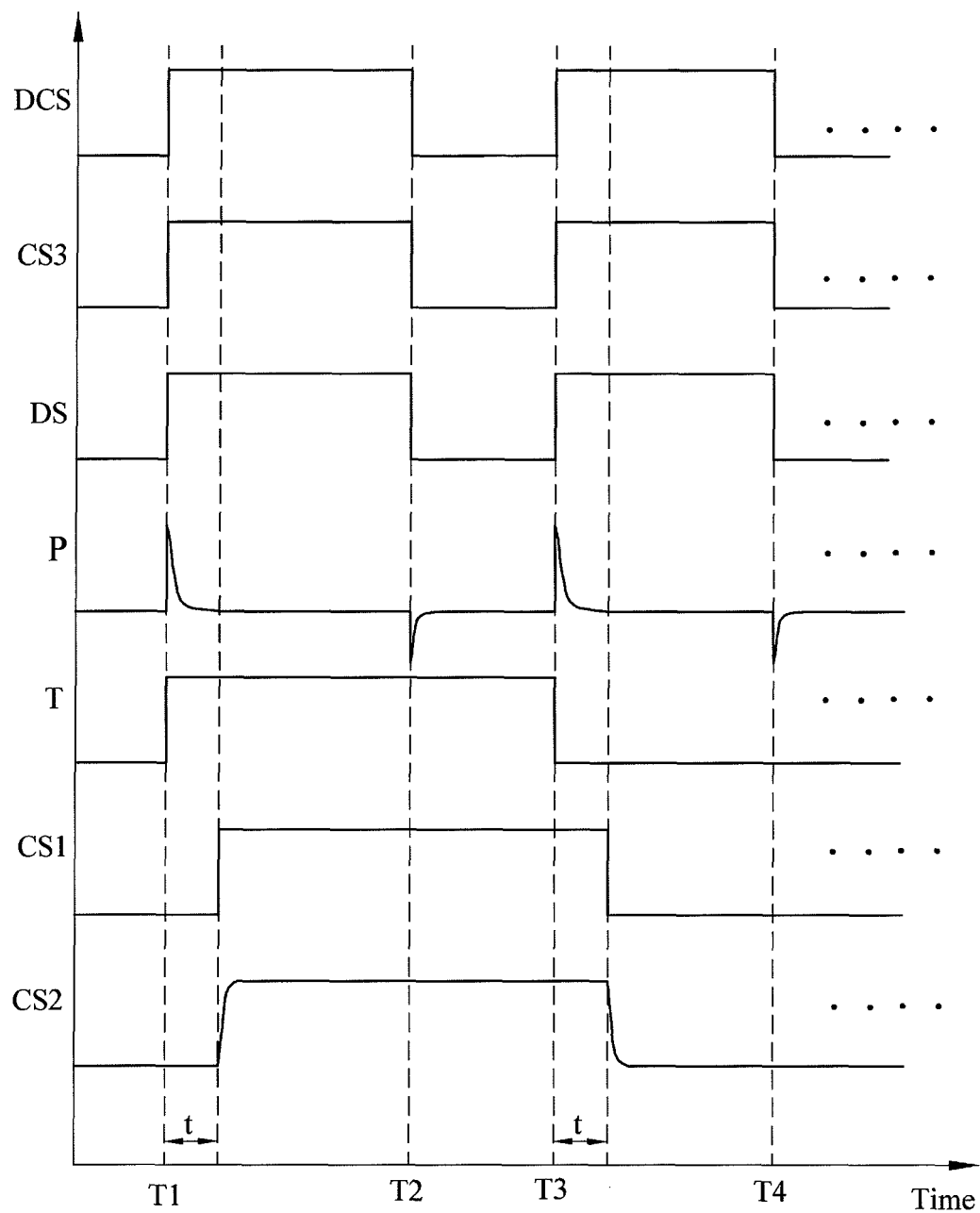
FIG. 5 is a timing chart of the control circuit of a cycling switch according to one embodiment of the invention.

The operation of the control circuit 1 will be described herein below with reference to FIGS. 4A and 5. FIG. 5 is a timing chart of the control circuit 1 of one embodiment, and the horizontal axis is a time axis.

At a first timing T1, the power switch 15 is turned on, the converter loop 14 outputs the DC signal DCS to the switch loop 11, and the third control loop 16 generates the third control signal CS3 to enable the switch loop 11 to output the driving signal DS. The DC signal DCS, the third control signal CS3 and the driving signal DS are all in the high level at the first timing T1. When the power switch 15 is turned on, the first filter unit 121 generates a pulse (the peak of the pulse signal P at the timing T1 as shown in FIG. 5) according to the driving signal DS at this moment, which is then transmitted to the trigger unit 122. At this timing T1, the second control signal CS2 is in low level, so that the trigger signal T outputted from the trigger unit 122 is in high level (opposite to the level of the second control signal CS2). The trigger signal T is delayed by the delay unit 123 for a period t, and the first control signal CS1 also becomes a high level signal. Thus, the storage unit 131 can be charged quickly by the charging unit 134 to allow the second control signal CS2 to become a high level signal too, which is then transmitted to the electronic equipment E to change its operation mode and function.

The first control signal CS1 of high level, which is inverted by the inverter unit 132, can turn on the first switch 51 to not charging the first capacitor C1, so that the discharging unit 133 is disabled. In this case, the storage unit 131 does not discharge, so the electricity stored in the storage unit 131 can be maintained.

When the power switch 15 is continuously turned on at the first timing T1, the switch loop 11 is also enabled, so that the driving signal DS and the third control signal CS3 are still in high level. Because the driving signal DS does not have variation, the pulse signal P is still in low level, so that the levels of the trigger signal T, first control signal CS1 and the second control signal CS2 are not changed. Since the second control signal CS2 is used to control the operation mode of the electronic equipment E, the operation mode and function of the electronic equipment E will not be changed.

At a second timing T2, the power switch 15 is turned off, so that the third control signal CS3 outputted by the third control loop 16 can control to disable the switch loop 11 so that the electronic equipment E will lose the driving signal DS and thus stop operating. Meanwhile, the electricity stored in the storage unit 131 can be maintained due to the configuration of the diode D1 of the charging unit 134, thereby keeping the second control signal CS2 in high level for a while.

At a third timing T3, the power switch 15 is turned on again, so that the third control signal CS3 outputted by the third control loop 16 can control to enable the switch loop 11 again so that the driving signal DS can be outputted to the first control loop 12 and to drive the electronic equipment E. When the power switch 15 is turned on again, the first filter unit 121 generates a pulse (the peak of the pulse signal P at the timing T3 as shown in FIG. 5) according to the driving signal DS at this moment, which is then transmitted to the trigger unit 122. At this timing T3, the level of the trigger signal T outputted by the trigger unit 122 is opposite to that of the second control signal CS2. In this case, the second control signal CS2 is in high level, so that the trigger signal T is in low level. The trigger signal T is delayed by the delay unit 123, and the first control signal CS1 outputted by the first control loop 12 also becomes a low level signal.

The first control signal CS1 of low level is transmitted to the inverter unit 132 of the second control loop 13, so that the signal outputted to the gate of the discharging unit 133 can be inverted to a high level signal for enabling the discharging unit 133. Accordingly, the storage unit 131 can be discharged to change the second control signal CS2 from the original high level to low level.

At a fourth timing T4, the power switch 15 is turned on again, so that the third control signal CS3 outputted by the third control loop 16 controls to disable the switch loop 11 so that the electronic equipment E will lose the driving signal DS and thus stop operating. In this case, the first control signal CS1 and the second control signal CS2 are both in low level, so that the operation mode and function of the electronic equipment E will not be changed.

Repeating the above-mentioned enabling action of the power switch charges the storage unit 131 again, so that the second control signal CS2 becomes a high level signal, thereby changing the operation mode and function of the electronic equipment E again.

As mentioned above, the control circuit 1 of one embodiment of the invention can enable/disable the power switch 15 to switch the operation mode and function of the electronic equipment E, so that the wiring design between the control circuit 1 and the electronic equipment E is simplified. Thus, it is simpler to replace the simple switch in the equipment. In addition, the electricity can be stored in the storage unit 131 as the power switch 15 is changed from turn-on to turn-off in a short time, and it supports the electronic equipment E to function for a while during the actions of starting and shutting down of the electronic equipment E. Therefore, the control circuit 1 of one embodiment of the invention does not need a storage device with a large capacity, such as the storage element 211 of FIG. 1 that is necessary in the conventional control circuit; wherein the power loop 22 and the driving loop 23 may have noise capacitances, and it still can achieve the purpose of energy saving.

Figure 6:
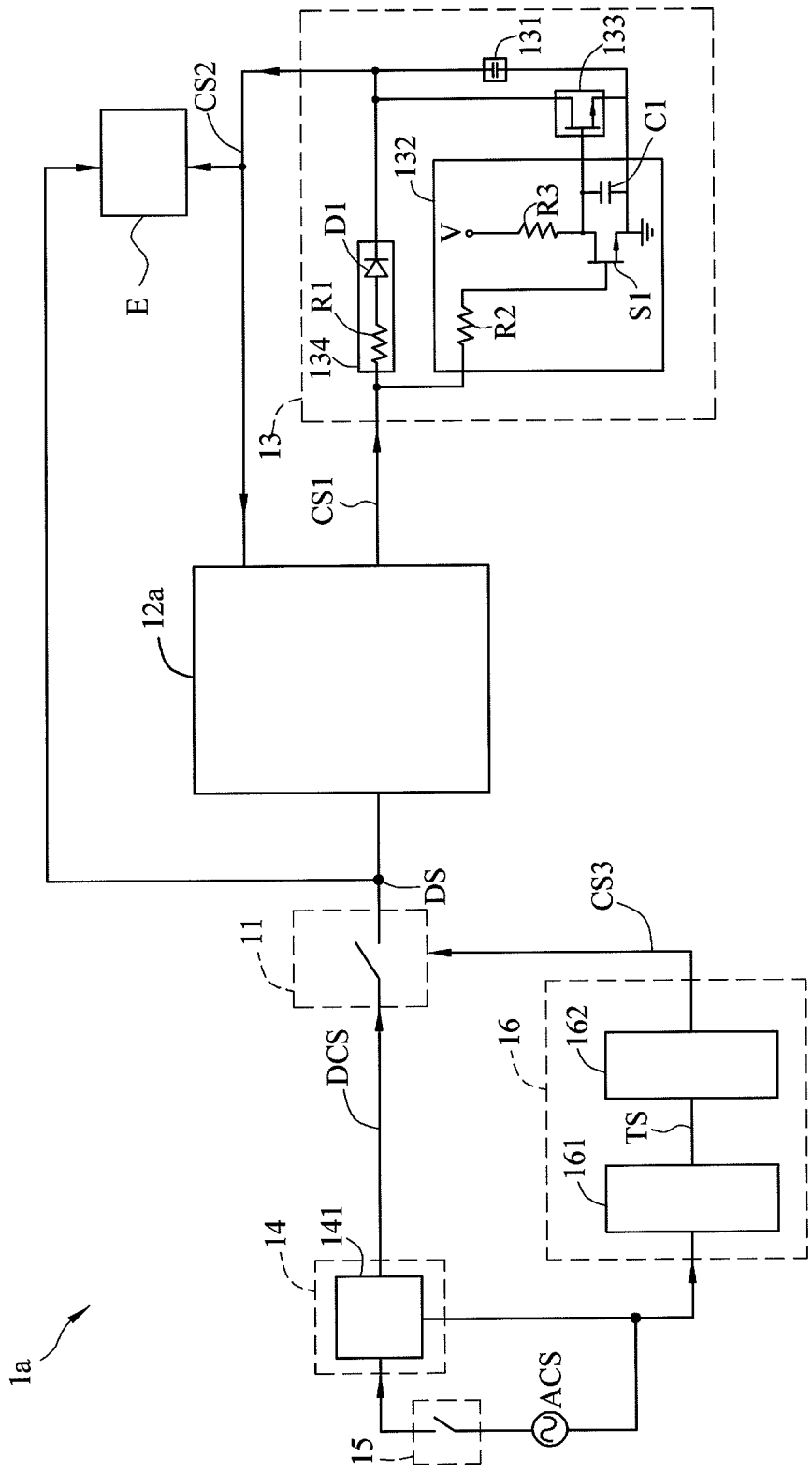
FIG. 6 is a schematic diagram showing another control circuit of a cycling switch according to one embodiment of the invention.

FIG. 6 is a schematic diagram showing another control circuit 1a of a cycling switch according to one embodiment of the invention.

Referring to FIG. 6, the control circuit 1a is different with the above-mentioned control circuit 1 in that the first control loop 12a of the control circuit 1a is a microprocessor. In this embodiment, the first control loop 12a has the same functions as the first filter unit 121, trigger unit 122 and delay unit 123 of the first control loop 12 of the control circuit 1. Accordingly, the first control loop 12a outputs a first control signal CS1 according to the driving signal DS and the second control signal CS2 for charging or discharging the storage unit 131 of the second control loop 13, thereby altering the voltage level of the second control signal CS2 and then changing the operation mode and function of the electronic equipment E.

Figure 7:
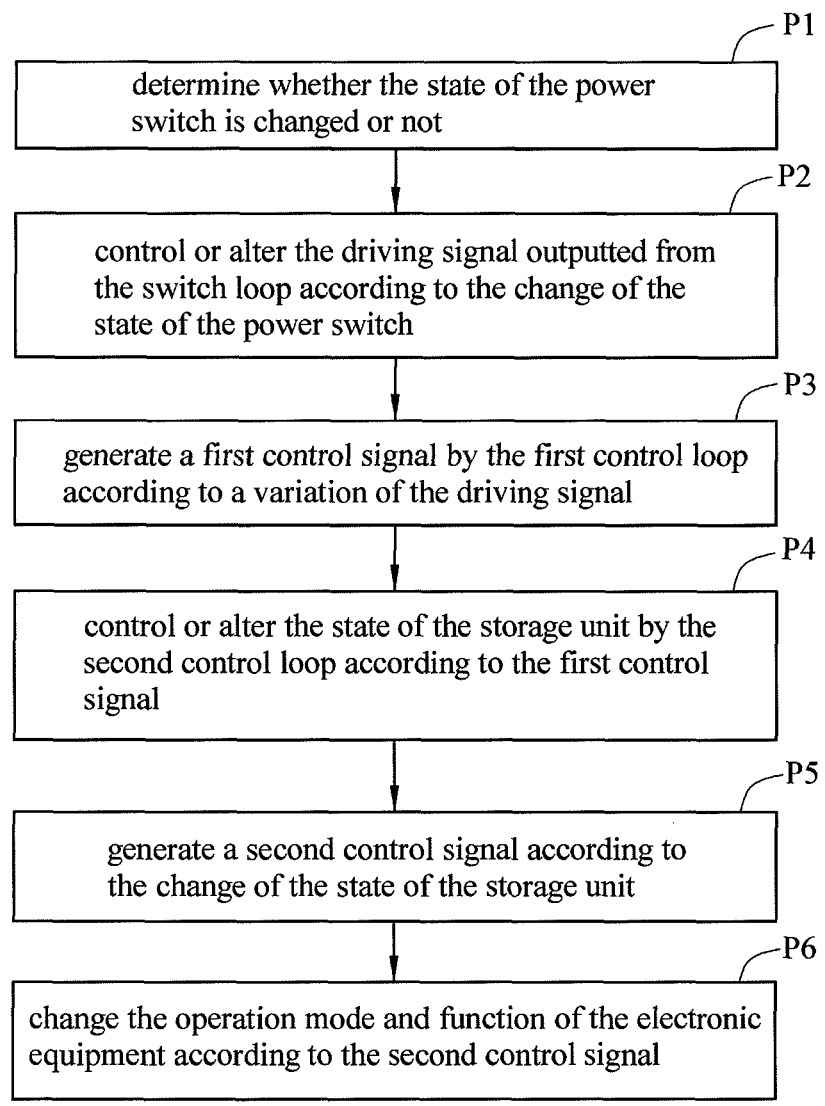
FIG. 7 is a flow chart of a control method of a control circuit of a cycling switch according to one embodiment of the invention.

The control method of the control circuit 1 of a cycling switch of one embodiment of the invention will be described herein below with reference to FIGS. 4A and 7. FIG. 7 is a flow chart of a control method of the control circuit 1 of a cycling switch according to one embodiment of the invention.

The control method of the control circuit 1 includes the following steps P1 to P6.

The step P1 is to determine whether the state of the power switch 15 is changed or not. In this step P1, the third control loop 16 is capable of determining whether the state of the power switch 15 is changed or not. When it determines that the state of the power switch 15 is changed, the third control signal CS3 outputted by the third control loop 16 is also changed.

The step P2 is to control or alter the driving signal DS outputted from the switch loop 11 according to the change of the state of the power switch 15. In this step P2, the third control loop 16 generates the third control signal CS3 for controlling or altering the state of the switch loop 11, thereby altering the driving signal DS. When the power switch 15 is turned on, the third control loop 16 outputs the third control signal CS3 to enable the switch loop 11, so that the switch loop 11 generates the driving signal DS according to the DC signal DCS to drive the electronic equipment E.

In the step P3, the first control loop 12 generates a first control signal CS1 according to a variation of the driving signal DS. Herein, the first control loop 12 generates a pulse signal P according to a variation of the driving signal DS and transmits the pulse signal P to the trigger unit 122. Then, the trigger unit 122 outputs a trigger signal T, which is delayed by the delay unit 123 so as to output the first control signal CS1. In the embodiment, the trigger unit 122 may be a D-type flip-flop that is positive edge triggered or negative edge triggered. The trigger unit 122 generates the trigger signal T according to the second control signal CS2 and the pulse signal P, and then the first control signal CS1 is generated according to the trigger signal T.

In the step P4, the second control loop 13 controls or alters the state of the storage unit 131 according to the first control signal CS1. Herein, the storage unit 131 is a capacitor, and to change the state of the storage unit 131 is to charge or discharge the storage unit 131. In this case, the storage unit 131 can be discharged by the discharging unit 133, or be charged by the charging unit 134.

The second control loop 13 further includes an inter unit 132, which can enable the discharging unit 133 according to the first control signal CS1, thereby discharging the storage unit 131. The inverter unit 132 has a first switch S1. When the first switch S1 is turned on according to the first control signal CS1 (e.g. when the first control signal CS1 is in high level, the NMOSFET of the first switch S1 is turned on), the discharging unit 133 (e.g. an NMOSFET) is disabled, so that the storage unit 131 is not discharged. Otherwise, when the first switch S1 is turned off according to the first control signal CS1, the discharging unit 133 is enabled, so that the storage unit 131 is discharged to change the store electricity therein. For example, each of the discharging unit 133 and the first switch S1 is a transistor.

The step P5 is to generate a second control signal CS2 according to the change of the state of the storage unit 131. In this embodiment, when the storage unit 131 is charged to high level according to the first control signal CS1, the second control signal CS2 outputted by the second control loop 13 becomes a high level signal.

The step P6 is to change the operation mode and function of the electronic equipment E according to the second control signal CS2. In this step P6, the second control signal CS2 of high level outputted by the second control loop 13 is transmitted to the electronic equipment E for switching the operation mode and function of the electronic equipment E.

To sum up, in the control circuit of a cycling switch and the control method thereof of the invention, the charging and discharging of the storage unit of the second control loop can control the electronic equipment to switch between different operation modes and functions. Thus, the wiring design between the control circuit and the electronic equipment may be simplified, and it may also be simpler to replace the switch in the equipment. In addition, the electricity may be stored in the storage unit within the control circuit, and it may support the electronic equipment to function for a while during the actions of starting and shutting down of the electronic equipment. Therefore, the control circuit of the invention does not need a storage device with a large capacity, and it still achieves the purpose of energy saving.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A control circuit of a cycling switch for controlling an electronic equipment, comprising:
   a switch loop generating a driving signal to drive the electronic equipment;
   a first control loop electrically connected with the switch loop and the electronic equipment respectively, and generating a first control signal according to a variation of the driving signal; and
   a second control loop electrically connected with the first control loop and the electronic equipment respectively, and having a storage unit, wherein the storage unit charges and discharges according to the first control signal, so that the second control loop generates a second control signal inputted to the first control loop and controlling the electronic equipment.

2. The control circuit according to claim 1, wherein the first control loop comprises a first filter unit electrically connected with the switch loop and outputting a pulse signal according to the variation of the driving signal.

3. The control circuit according to claim 2, wherein the first filter unit is a high-pass filter.

4. The control circuit according to claim 2, wherein the first control loop further comprises a trigger unit electrically connected with the first filter unit and generating a trigger signal according to the second control signal and the pulse signal.

5. The control circuit according to claim 4, wherein the trigger unit is a D-type flip-flop.

6. The control circuit according to claim 4, wherein the first control loop further comprises a delay unit electrically connected with the trigger unit and the second control loop for delaying the trigger signal, thereby delaying the first control signal.

7. The control circuit according to claim 6, wherein the second control loop further comprises an inverter unit and a discharging unit, the inverter unit is electrically connected with the delay unit and the discharging unit, the discharging unit is electrically connected with the storage unit, the inverter unit controls to enable/disable the discharging unit according to the first control signal, and the discharging unit is capable of discharging the storage unit when the discharging unit is enabled.

8. The control circuit according to claim 7, wherein the second control loop further comprises a charging unit electrically connected with the delay unit, the inverter unit, the discharging unit, and the storage unit for charging the storage unit based on the first control signal.

9. The control circuit according to claim 8, wherein the charging unit comprises a first resistor and a diode, the first resistor is electrically connected with the delay unit and the diode, and the diode is electrically connected with the discharging unit and the storage unit.

10. The control circuit according to claim 9, wherein the inverter unit comprises a first switch electrically connected with the discharging unit, when the first switch is turned on based on the first control signal, the discharging unit is disabled so that the storage unit is not discharged, and when the first switch is turned off based on the first control signal, the discharging unit is enabled, so that the storage unit is discharged.

11. The control circuit according to claim 10, wherein the inverter unit further comprises a first capacitor electrically connected with the first switch and the discharging unit.

12. The control circuit according to claim 10, wherein each of the discharging unit and the first switch is a transistor.

13. The control circuit according to claim 1, further comprising:
   a converter loop electrically connected with the switch loop and generating a DC signal according to an AC signal to the switch loop.

14. The control circuit according to claim 13, further comprising:
   a power switch electrically connected with the switch loop, wherein when the power switch is turned on, the converter loop outputs the DC signal according to the AC signal.

15. The control circuit according to claim 14, further comprising:
   a third control loop electrically connected with the switch loop and the converter loop respectively, and outputting a third control signal according to the AC signal to enable the switch loop, so that the switch loop generates the driving signal according to the DC signal to drive the electronic equipment.

16. The control circuit according to claim 15, wherein the third control loop comprises a transformer unit and a second filter unit, the transformer unit is electrically connected with the converter loop and the second filter unit, the second filter unit is electrically connected with the switch loop, and the transformer unit outputs a transform signal according to the AC signal to the second filter unit, so that the second filter unit generates the third control signal to control the switch loop.

17. The control circuit according to claim 16, wherein the second filter unit is a low-pass filter.

18. The control circuit according to claim 1 or 15, wherein the first control loop is a microprocessor.

19. The control circuit according to claim 1 or 15, wherein the storage unit is a capacitor.

20. A control method of a control circuit of a cycling switch, the control circuit controlling an electronic equipment and comprising a power switch, a switch loop, a first control loop and a second control loop, the switch loop outputting a driving signal, while the power switch is turned on, to drive the electronic equipment, and the second control loop comprising a storage unit, the control method comprising the steps of:
   determining whether the state of the power switch is changed or not;

controlling or altering the driving signal outputted from the switch loop according to the change of the state of the power switch;

generating a first control signal by the first control loop according to a variation of the driving signal;

controlling or altering the state of the storage unit by the second control loop according to the first control signal; and generating a second control signal according to the change of the state of the storage unit.

21. The control method according to claim 20, wherein the step of determining whether the state of the power switch is changed or not is performed by a third control loop, and the third control loop is capable of generating a third control signal to control or alter the state of the switch loop, thereby controlling or altering the driving signal.

22. The control method according to claim 20, wherein the step of altering the driving signal outputted from the switch loop is performed by using a third control loop to generate a third control signal to control or alter the state of the switch loop, thereby controlling or altering the driving signal.

23. The control method according to claim 20, wherein to change the state of the storage unit is to charge or discharge the storage unit.

* * * * *